(12) United States Patent
Iizuka et al.

(10) Patent No.: US 9,552,861 B2
(45) Date of Patent: *Jan. 24, 2017

(54) RESISTANCE CHANGE MEMORY

(71) Applicant: KABUSHIKI KAISHA TOSHIBA, Minato-ku, Tokyo (JP)

(72) Inventors: Mariko Iizuka, Yokohama Kanagawa (JP); Kosuke Hatsuda, Tokyo (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/019,425

(22) Filed: Feb. 9, 2016

(65) Prior Publication Data

US 2016/0155486 A1 Jun. 2, 2016

Related U.S. Application Data

(63) Continuation of application No. 14/482,978, filed on Sep. 10, 2014, now Pat. No. 9,293,171.

(Continued)

(51) Int. Cl.
| | |
|---|---|
| *G11C 13/00* | (2006.01) |
| *G11C 11/16* | (2006.01) |
| *G11C 5/06* | (2006.01) |
| *G11C 16/26* | (2006.01) |
| *G11C 11/00* | (2006.01) |
| *G11C 7/14* | (2006.01) |
| *G11C 7/12* | (2006.01) |
| *G11C 7/18* | (2006.01) |

(Continued)

(52) U.S. Cl.
CPC .............. *G11C 11/1673* (2013.01); *G11C 5/06* (2013.01); *G11C 7/12* (2013.01); *G11C 7/18* (2013.01); *G11C 11/1655* (2013.01); *G11C 11/1675* (2013.01); *G11C 13/0002* (2013.01); *G11C 13/004* (2013.01); *G11C 13/0026* (2013.01); *G11C 13/0069* (2013.01); *G11C 5/02* (2013.01); *G11C 5/025* (2013.01); *G11C 11/5607* (2013.01); *G11C 2013/0054* (2013.01)

(58) Field of Classification Search
CPC ................. G11C 13/004; G11C 13/002; G11C 2013/0054; G11C 11/1673; G11C 11/5607; G11C 13/0069; G11C 5/06; G11C 5/02
USPC ................................... 365/148, 158, 163, 66
See application file for complete search history.

(56) References Cited

U.S. PATENT DOCUMENTS

| | | |
|---|---|---|
| 6,418,046 B1 | 7/2002 | Naji |
| 2011/0261616 A1 | 10/2011 | Kim |

(Continued)

FOREIGN PATENT DOCUMENTS

JP 5316114 B2 10/2013

*Primary Examiner* — Ly D Pham
(74) *Attorney, Agent, or Firm* — Holtz, Holtz & Volek PC

(57) ABSTRACT

A first normal bit and source lines are connected to a first memory cell. Second normal bit and source lines are connected to a second memory cell. A first column switch connects one of the first and second normal bit lines to a first global bit line. A second column switch connects one of the first and second normal source lines to a first global source line. A first reference bit and source lines are connected to a third memory cell. A third column switch connects the first reference bit line to a second global bit line. A fourth column switch connects the first reference source line to the first global source line. A sense amplifier is connected to the first and second global bit lines, and reads data stored in one of the first and second memory cells.

10 Claims, 14 Drawing Sheets

Related U.S. Application Data

(60) Provisional application No. 61/952,590, filed on Mar. 13, 2014.

(51) Int. Cl.
*G11C 11/56* (2006.01)
*G11C 5/02* (2006.01)

(56) References Cited

U.S. PATENT DOCUMENTS

| | | |
|---|---|---|
| 2012/0057400 A1 | 3/2012 | Kim et al. |
| 2013/0051122 A1 | 2/2013 | Mori et al. |
| 2013/0058169 A1 | 3/2013 | Lee et al. |
| 2014/0286088 A1 | 9/2014 | Takahashi et al. |

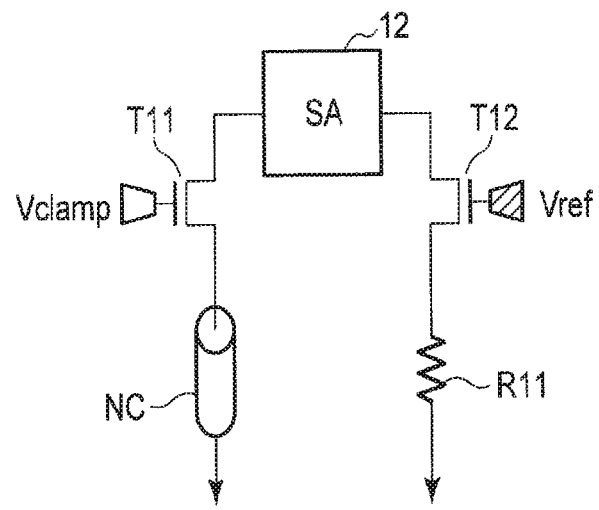
F I G. 1
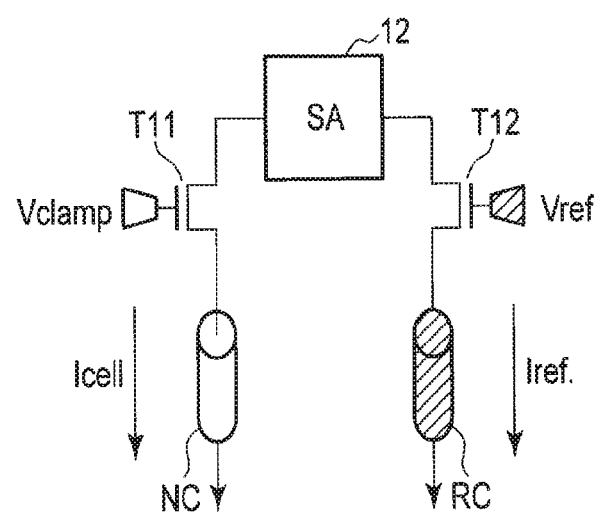
F I G. 2

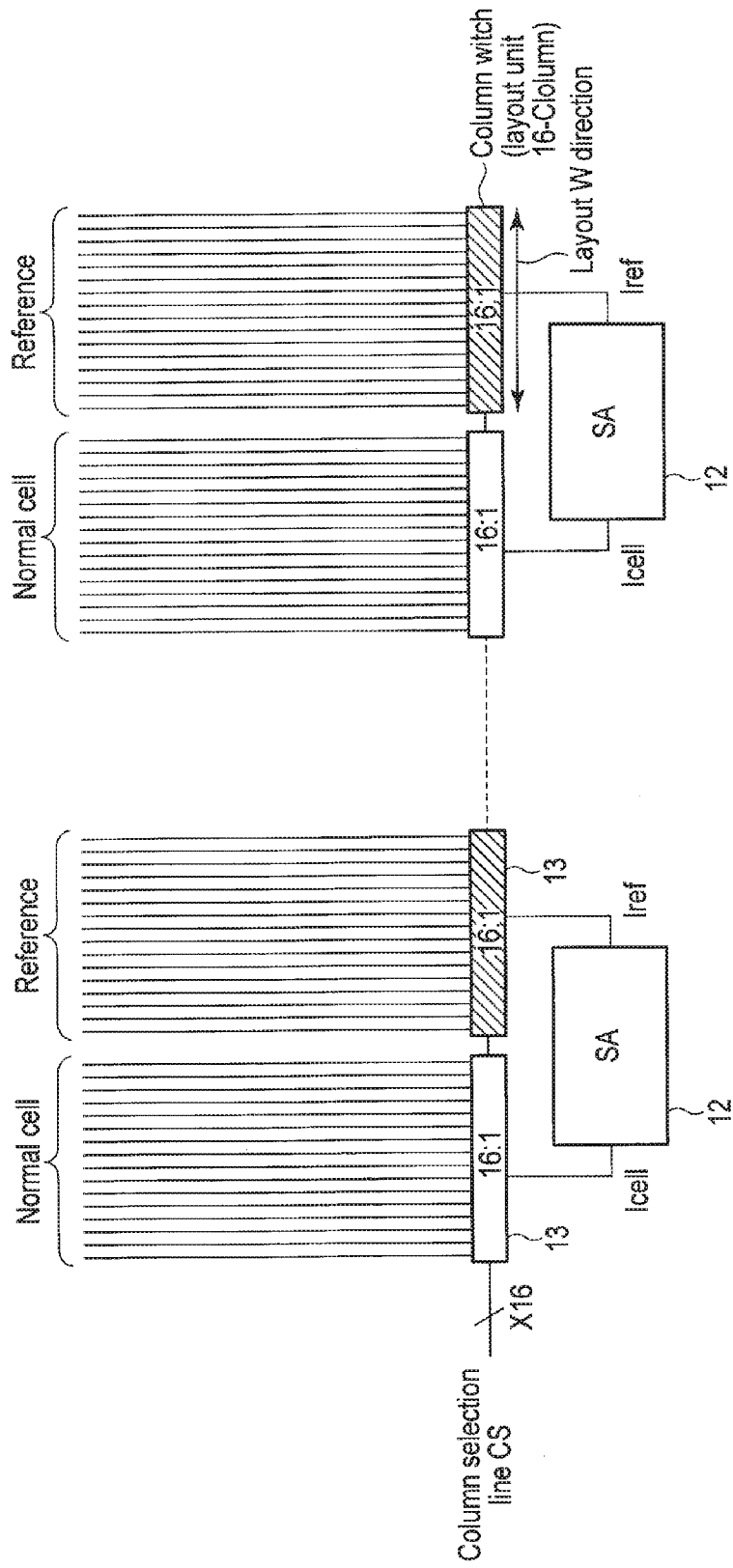
F I G. 3

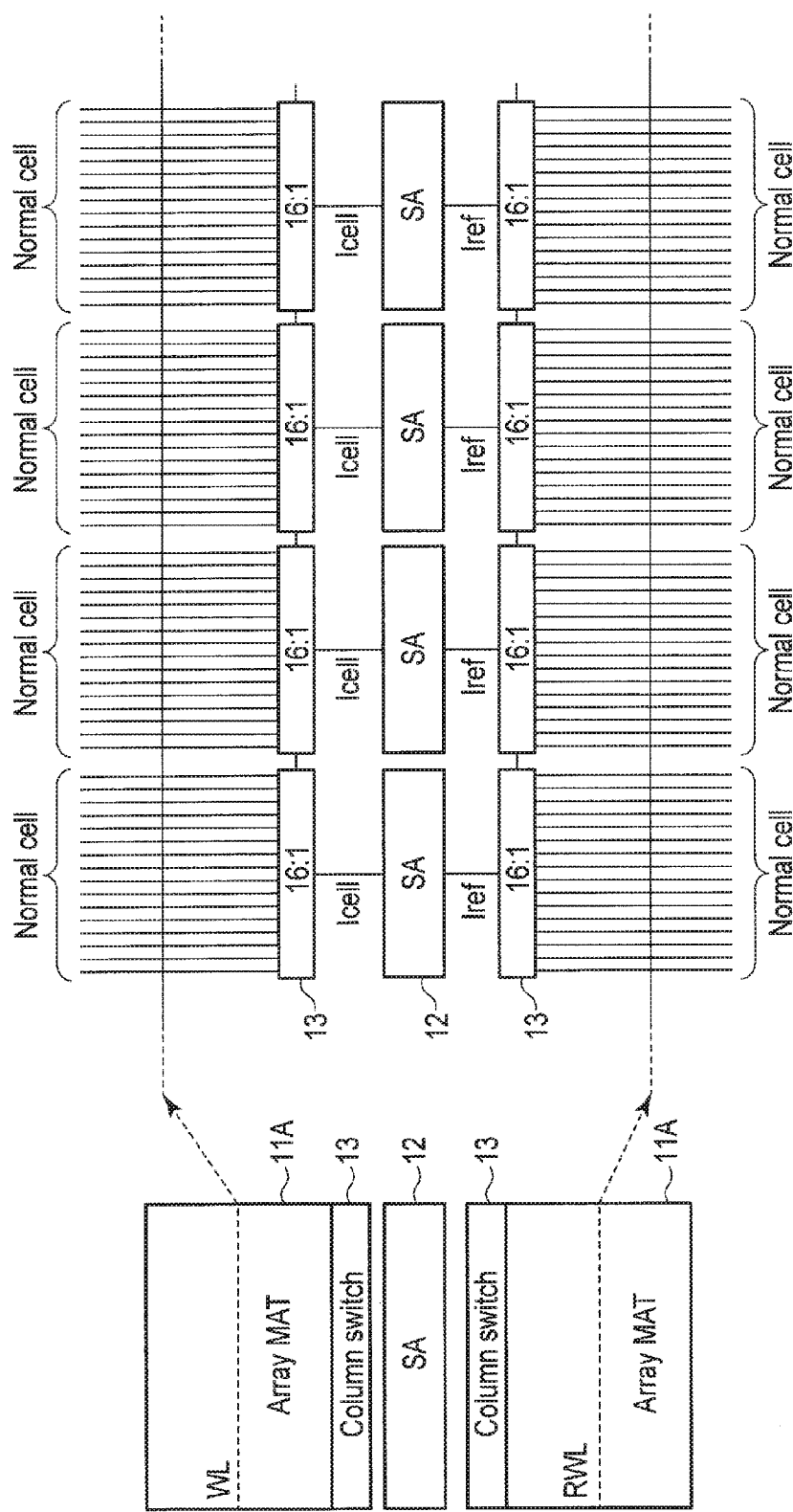
F I G. 4

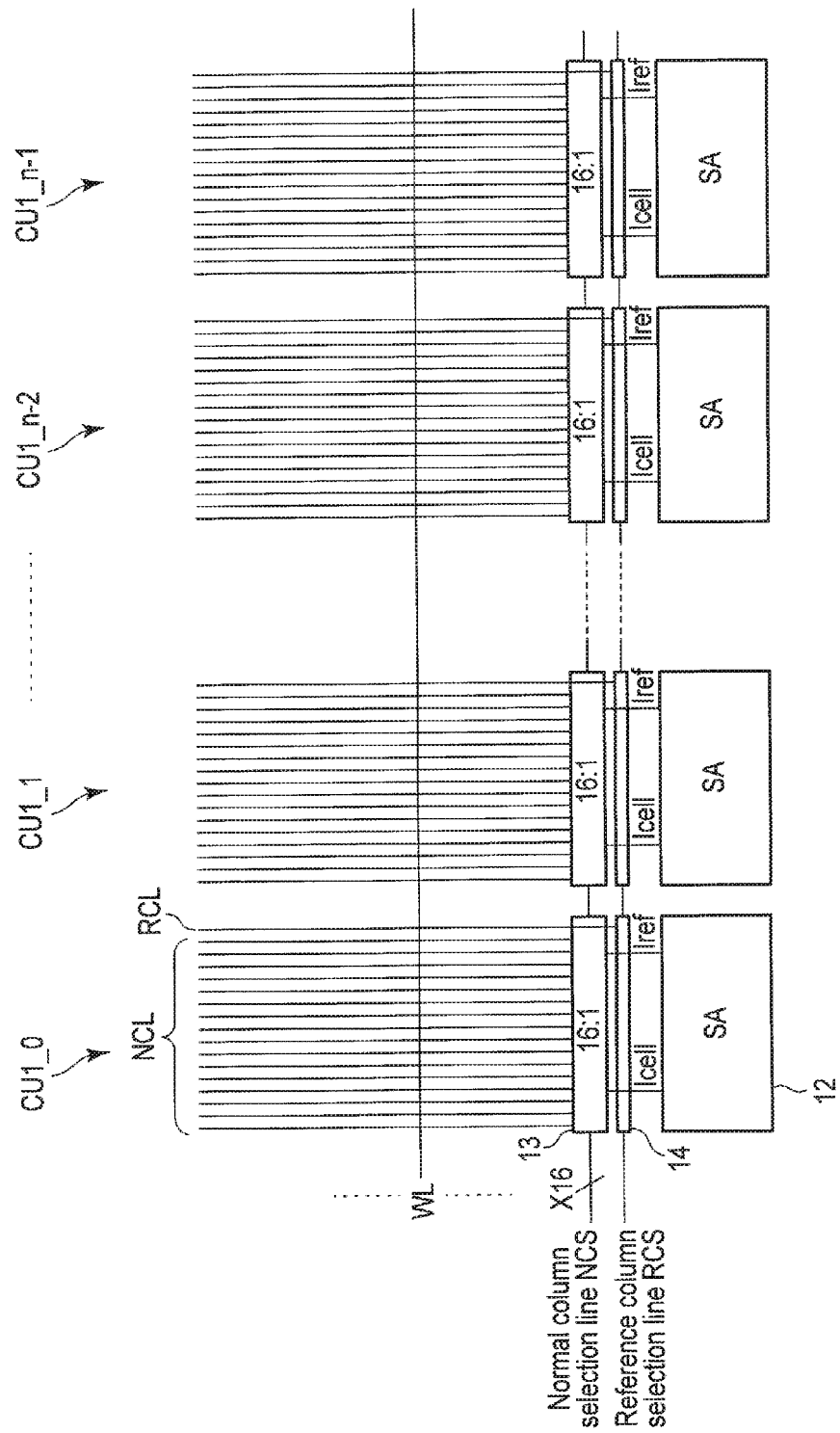
F I G. 6

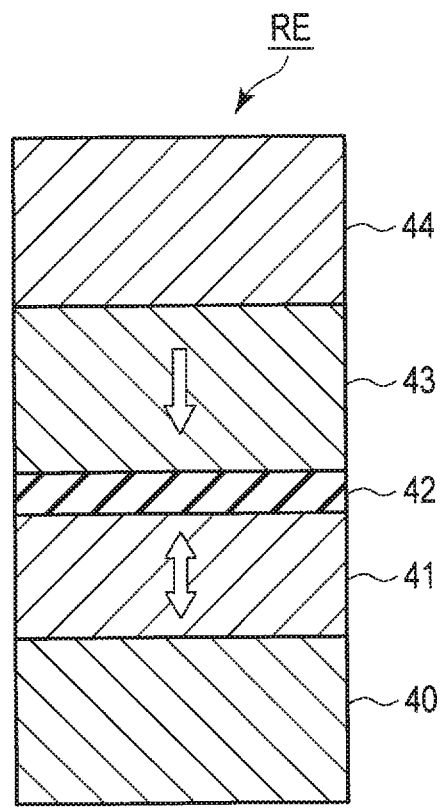
F I G. 8

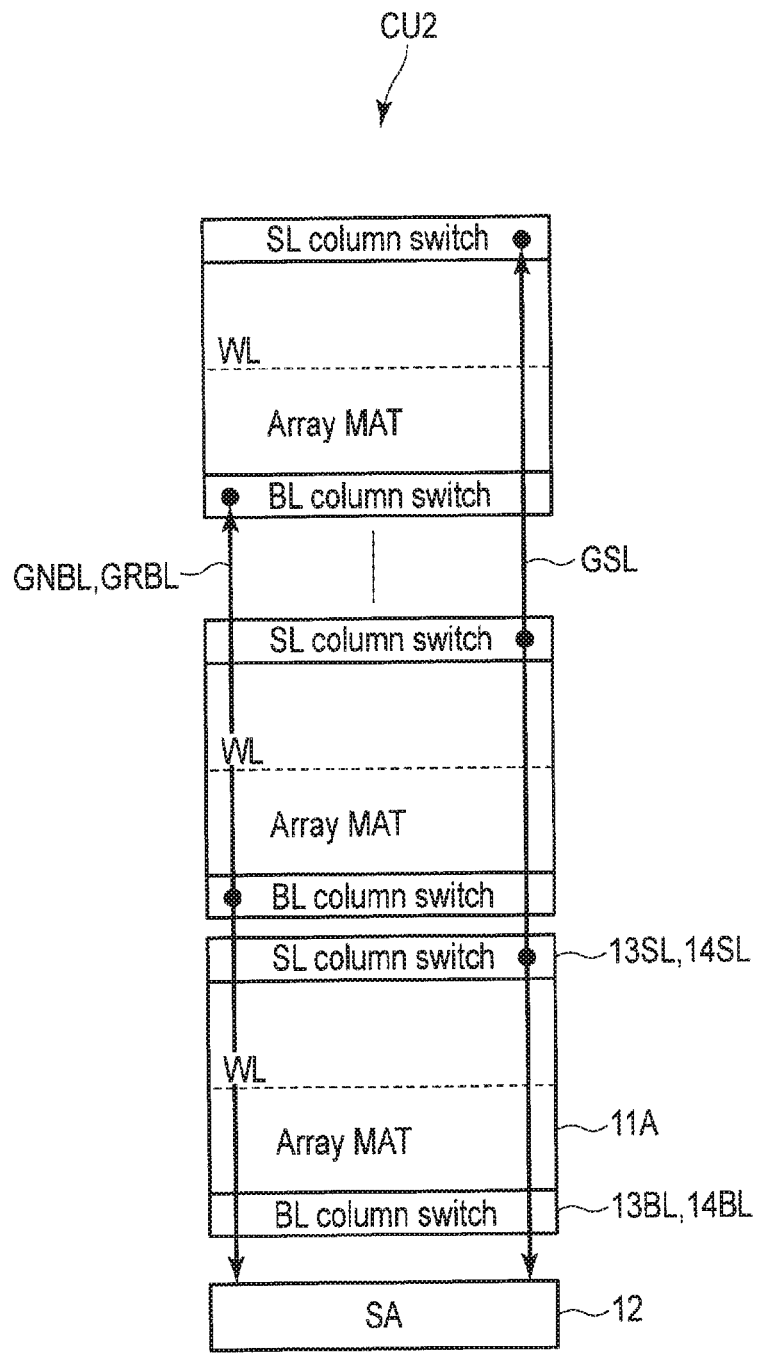
F I G. 9

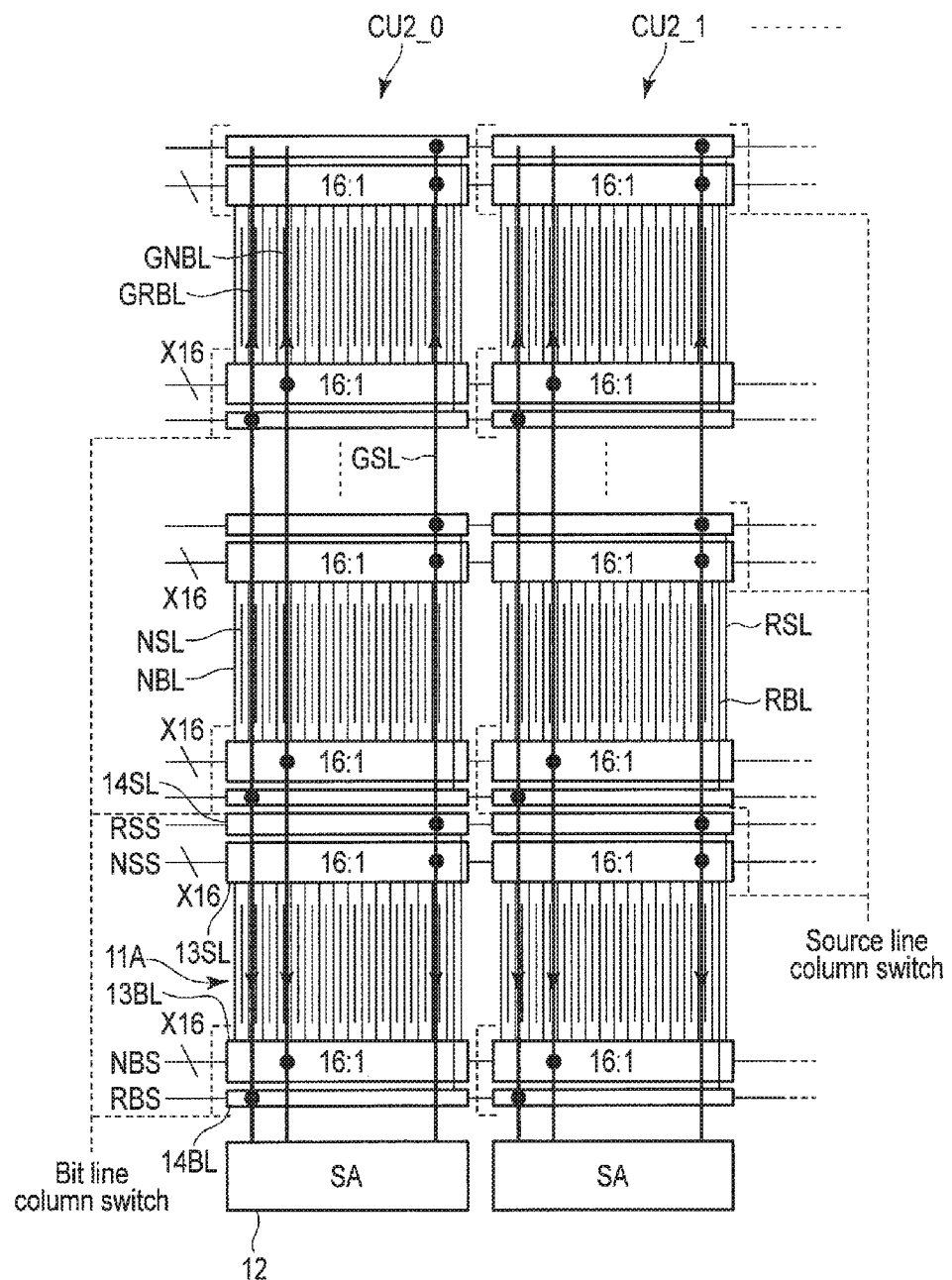
F I G. 10

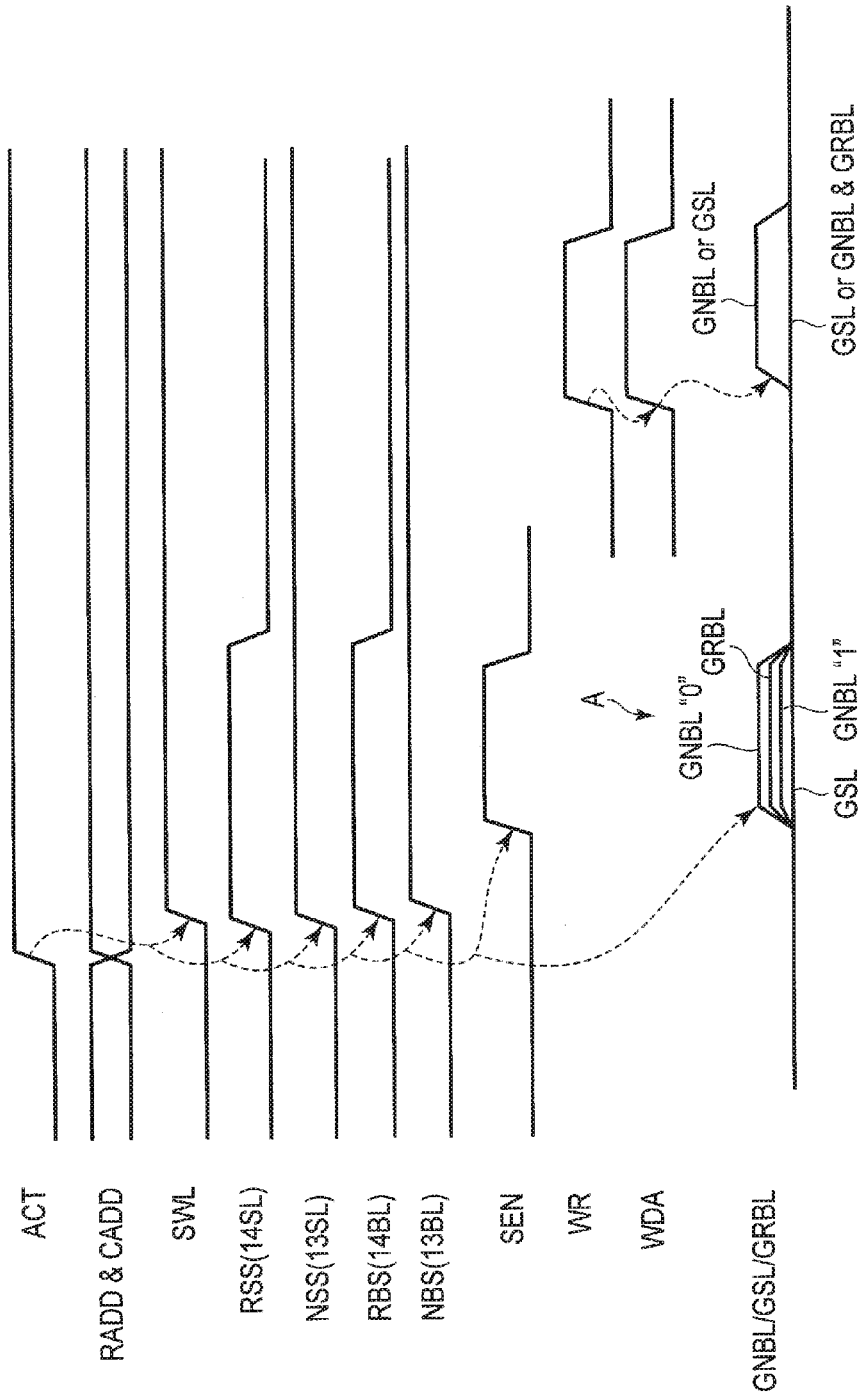
F I G. 12

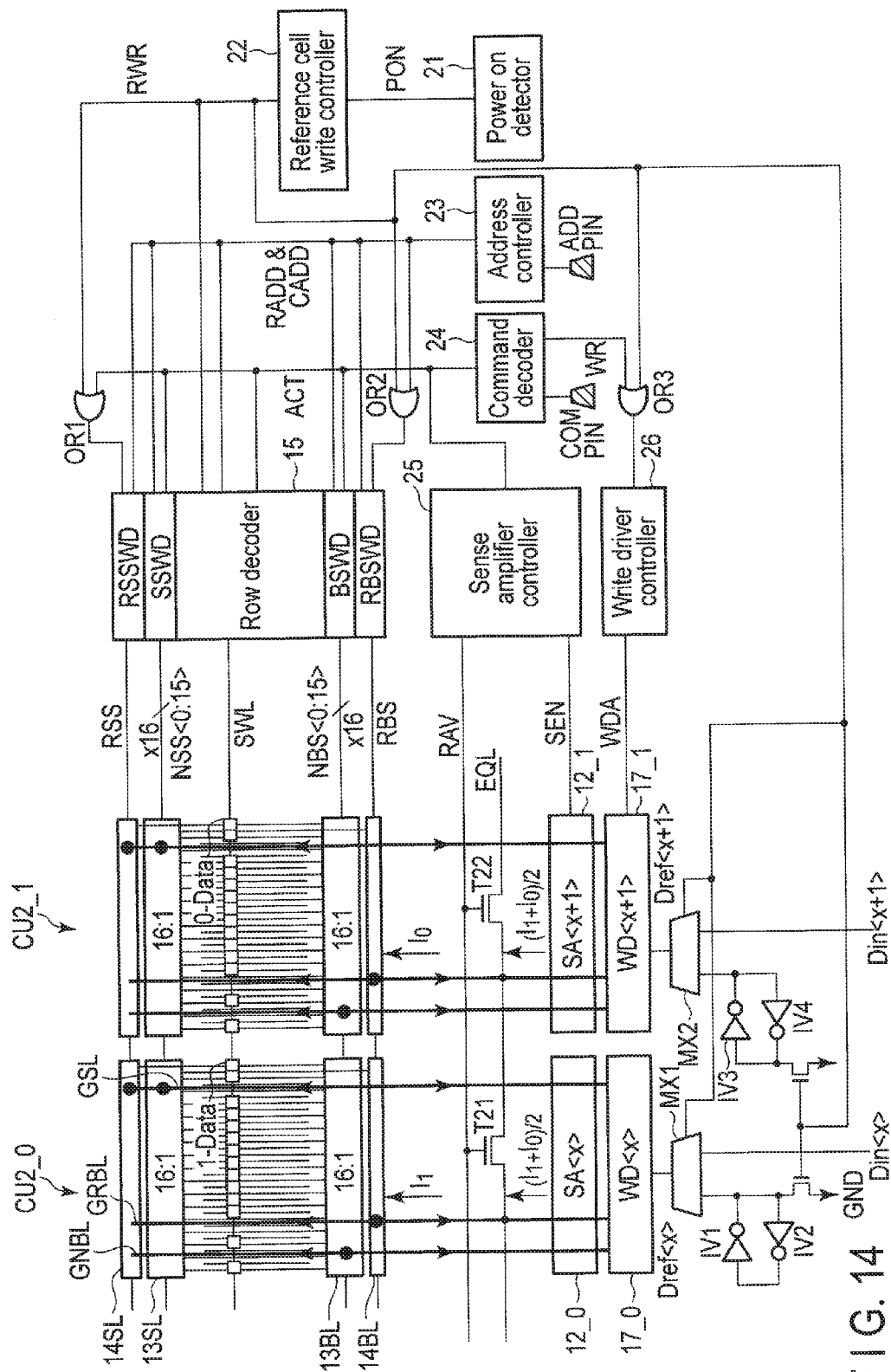
F I G. 14

RESISTANCE CHANGE MEMORY

CROSS-REFERENCE TO RELATED APPLICATIONS

This application is a Continuation application of U.S. Ser. No. 14/482,978, filed Sep. 10, 2014, which claims the benefit of U.S. Provisional Application No. 61/952,590, filed Mar. 13, 2014, the entire contents of both of which are incorporated herein by reference.

FIELD

Embodiments described herein relate generally to a resistance change memory storing data based on different resistance values of a memory element.

BACKGROUND

In recent years, semiconductor memories in which non-volatile memories, for example, a resistance change memory (Magnetoresistive Random Access Memory (MRAM), Phase Change Random Access Memory (PRAM), Resistive Random Access Memory (ReRAM), and the like) are used as semiconductor memory devices are attracting attention.

In a resistance change memory, data "1" or "0" is determined by using a change in the resistance value when an electric current (or a voltage) is applied.

BRIEF DESCRIPTION OF THE DRAWINGS

FIG. 1 is a circuit diagram in a case where a diffusion layer resistance is used as a reference electric current generation resistance in a resistance-type memory cell;

FIG. 2 is a circuit diagram in a case where a memory cell is used as a reference electric current generation resistance in the resistance-type memory cell;

FIGS. 3 and 4 are configuration diagrams showing units of column switches in a case where a memory cell is used as the reference electric current generation resistance;

FIG. 6 is a figure illustrating a configuration of a memory cell array, a sense amplifier, and a column switch in the MRAM;

FIG. 8 is a cross sectional view illustrating an MTJ element included in the memory cell in the MRAM;

FIG. 9 is a block diagram illustrating a configuration of a column unit in an MRAM according to a second embodiment;

FIG. 10 is a figure illustrating a detailed configuration of the column unit in the MRAM;

FIG. 12 is a timing chart illustrating a read operation and write operation of the MRAM;

FIG. 14 is a figure illustrating a configuration in a case where a reference cell is written in a power on state in the MRAM.

DETAILED DESCRIPTION

Figure 5:
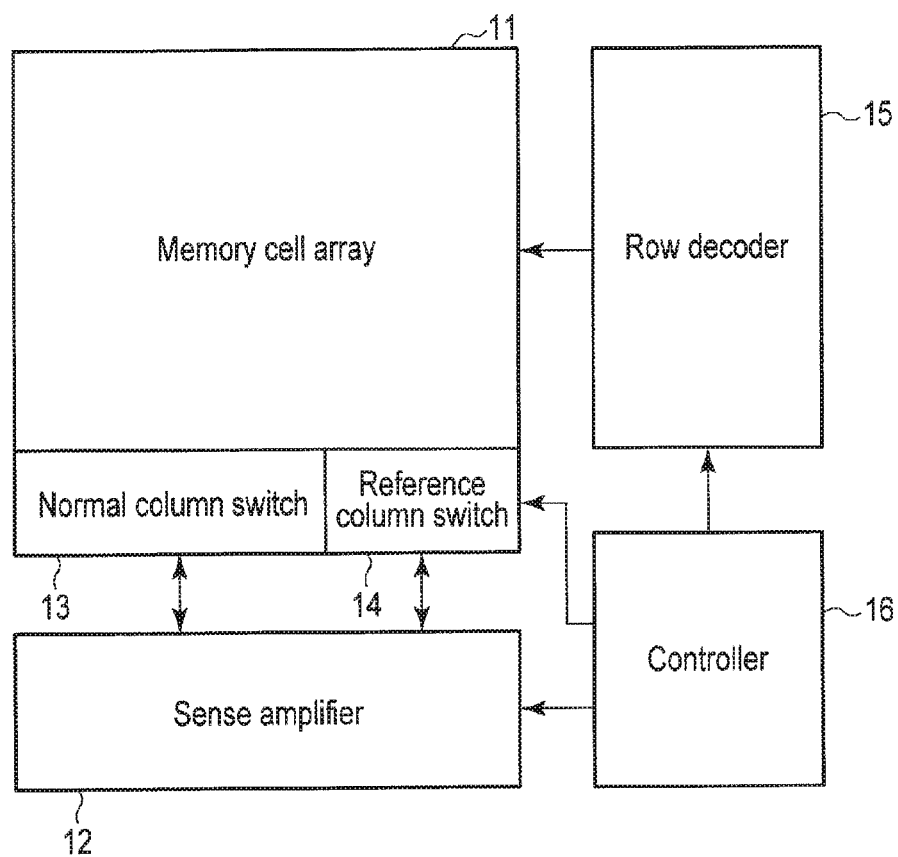
FIG. 5 is a block diagram illustrating a schematic configuration of an MRAM according to a first embodiment.

In general, according to one embodiment, a resistance change memory includes a first memory cell array, a first and second normal bit lines, first and second normal source lines, first, second, third, and fourth column switches, a first reference bit line, a first reference source line, and a first sense amplifier. The first memory cell array is arranged with memory cells having resistance change elements. The first normal bit line is connected to one end of a first memory cell in the first memory cell array. The first normal source line is connected to the other end of the first memory cell. The second normal bit line is connected to one end of a second memory cell in the first memory cell array. The second normal source line is connected to the other end of the second memory cell. The first column switch is configured to select one of the first and second normal bit lines, and connect the selected one of the first and second normal bit lines to a first global bit line. The second column switch is configured to select one of the first and second normal source lines, and connect the selected one of the first and second normal source lines to a first global source line. The first reference bit line is connected to one end of a third memory cell in the first memory cell array. The first reference source line is connected to the other end of the third memory cell. The third column switch is configured to connect the first reference bit line to a second global bit line. The fourth column switch is configured to connect the first reference source line to the first global source line. The first sense amplifier is connected to the first global bit line and the second global bit line, and configured to read data stored in any one of the first and second memory cells.

Before explaining the embodiments, the background to the present application will be explained.

In a case where a sense amplifier is used to read an electric current from a memory cell in a resistance-type cell provided in a resistance change memory, the memory cell itself may be used as a reference electric current generation resistance (a reference resistance), or other resistances (for example, a diffusion layer resistance) may be used.

FIG. 1 illustrates a case where a diffusion layer resistance is used as a reference electric current generation resistance. FIG. 2 illustrates case where a memory cell itself is used.

As shown in FIG. 1, a normal cell NC and a diffusion layer resistance R11 are connected to a sense amplifier (SA) 12 via transistors T11, T12, respectively. When, for example, the diffusion layer resistance R11 other than the normal cell NC is used as the reference resistance, for example, the temperature characteristic and the process variation characteristic of the diffusion layer resistance R11 differ from the normal cell NC which is to be read; therefore, it is difficult to ensure a sense margin.

In FIG. 2, a normal cell NC and a reference cell RC are connected to a sense amplifier 12 via transistors T11, T12, respectively. The normal cell NC and the reference cell RC have the same structure and are formed by the same manufacturing processes.

When the reference cell RC is used as the reference resistance, for example, the temperature characteristic and the process variation characteristic of the reference resistance are the same as those of the normal cell NC which is to be read. Therefore, when the reference cell RC is used as the reference resistance, it is easy to ensure the margin for the process variation, the voltage variation, and the temperature variation, and the like.

However, when the same reference cell as the normal cell NC is used as the reference resistance, the same number of reference electric current resistance paths as the number of normal cells NC are required as shown in FIG. 3. In this case, it is difficult to arrange column switches by changing the layout unit (layout width direction); therefore, the reference cell is arranged for each of units of column switches, and it is necessary to arrange the same number of reference cells as the number of normal cells. For this reason, the size of area of the memory cell array increases, and further, the chip size increases.

More specifically, the column interconnects are preferably arranged for units of column switches in terms of the layout, but when the reference cells are arranged for units of column switches, the same column switch control as that of the normal cell is performed. As a result, it is necessary to arrange the same number of reference cells as the number of the normal cells, and the chip size increases.

In order to solve this problem, the configuration as shown in FIG. 4 is such that a column switch 13 and an array MAT 11A serving as a memory cell array are arranged at one side of the sense amplifier 12, and a column switch 13 and an array MAT 11A are arranged at the other side opposite to the one side. Accordingly, it is not necessary to arrange a reference cell, and the chip size will not increase.

In such a configuration, a word line dedicated to the reference cell is arranged in each array MAT 11A, and the reference cell of the array MAT opposite to the array MAT where the activated normal word line is located is adopted as a reference electric current generation resistance. In this method, however, it is necessary to activate two word lines, which increases the electric power.

In the present embodiment, a resistance change memory is provided, in which the size of the memory cell array increases to a lesser extend due to the arrangement of the reference cell, and further, in the read operation, the electric power for activating the word line can be reduced.

A resistance change memory according to an embodiment will be hereinafter explained with reference to the drawings. In the explanation below, constituent elements having the same functions and configurations are denoted with the same reference numerals, and repeated explanations thereof are made only when necessary. It should be noted that an interconnect and a signal propagated by the interconnect will be denoted by the same reference numerals, and only when the interconnect and the signal have to be explained separately will the interconnect and the signal will be denoted by different reference numerals. Each embodiment explained below is given as an example of an apparatus and a method for realizing the technical concept of this embodiment, and the materials, shapes, structures, arrangements, and the like of constituent components are not limited to those described below.

In the embodiment explained below, an MRAM is explained as an example of a resistance change memory.

[First Embodiment]

[1] Configuration of MRAM

FIG. 5 is a block diagram illustrating a schematic configuration of an MRAM according to a first embodiment.

The MRAM of the present embodiment includes a memory cell array 11, a sense amplifier (SA) 12, a normal column switch 13, a reference column switch 14, a row decoder 15 and a controller 16.

The memory cell array 11 includes multiple memory cells arranged in a matrix manner. In this case, the memory cell has a magnetoresistive effect element serving as a resistance change element, for example, an MTJ (magnetic tunnel junction) element. The detailed configuration of the memory cell will be explained later in detail.

The sense amplifier 12 reads data stored in the memory cell. In the case of, for example, an electric current detect method, the sense amplifier 12 compares a cell electric current flowing to a selected memory cell via a normal bit line and a reference electric current flowing to a reference cell via a reference bit line, thus detecting and amplifying data in the selected memory cell.

The normal column switch 13 connects the normal bit line and the sense amplifier 12 in accordance with a first selection signal. The reference column switch 14 connects the reference bit line and the sense amplifier 12 in accordance with a second selection signal.

The row decoder 15 selects any one of multiple word lines based on a row address.

The controller 16 centrally controls the operation of the sense amplifier 12, the normal column switch 13, the reference column switch 14, and the row decoder 15. The controller 16 receives an address (including a row address and a column address), a control signal such as a clock CLK, and a command. Then, the controller 16 provides various kinds of control signals and various kinds of voltage to the sense amplifier 12, the normal column switch 13, the reference column switch 14, and the row decoder 15, thus controlling the operations of these circuits.

[1-1] Configurations of memory cell array, sense amplifier and column switch

FIG. 6 is a figure illustrating a configuration of the memory cell array 11, the sense amplifier 12, the normal column switch 13, and the reference column switch 14 according to the first embodiment.

The MRAM according to the first embodiment includes multiple column units CU1_0 to CU1_n−1. Each column unit CU1 is a unit for individually performing a write operation of data and read operation of data (interleave processing and parallel processing). It should be noted that n is a natural number equal to or more than 1.

Each column unit CU1 includes sixteen normal column interconnects NCL and a reference column interconnect RCL. Each normal column interconnect NCL is connected to multiple memory cells. Likewise, the reference column interconnect RCL is connected to multiple memory cells. In this case, a memory cell connected to a normal column interconnect NCL will be referred to as a normal cell, and a memory cell connected to a reference column interconnect RCL will be referred to as a reference cell.

The normal column interconnect NCL is connected to the normal column switch 13. The reference column interconnect RCL is connected to the reference column switch 14. Further, the normal column switch 13 and the reference column switch 14 are connected to the sense amplifier 12

The normal column switch 13 is connected to a normal column selection line NCS. A normal column selection signal NCS is input from the controller 16 into the normal column switch 13 via the normal column selection line NCS. In accordance with the normal column selection signal NCS, the normal column switch 13 selects a normal column interconnect from among multiple normal column interconnects NCL, and connects the selected normal column interconnect NCL and the sense amplifier 12. Accordingly, a memory cell in a column direction is selected.

The reference column switch 14 is connected to the reference column selection line RCS. The reference column selection signal RCS is input from the controller 16 into the reference column switch 14 via the reference column selection line RCS. The reference column switch 14 connects the reference column interconnect RCL and the sense amplifier 12 in accordance with the reference column selection signal RCS.

Multiple word lines WL are arranged so as to cross the normal column interconnects NCL and the reference column interconnect RCL. Each word line WL is connected to multiple memory cells. When the word line WL is activated, the memory cells in a row direction are selected.

During the read operation, the selected word line WL is activated, the normal column interconnect NCL and the reference column interconnect RCL are selected, and the normal column interconnect NCL and the reference column interconnect RCL are connected to the sense amplifier 12. Accordingly, a cell electric current Icell flows into a memory cell (normal cell) MC selected by the selected word line WL and the normal column interconnect NCL, and a reference electric current Iref flows into a reference cell selected by the selected word line WL and the reference column interconnect RCL. The sense amplifier 12 compares the cell electric current Icell and the reference electric current Iref, and reads data stored in the memory cell MC selected on the basis of such magnitude relationship.

Figure 7:
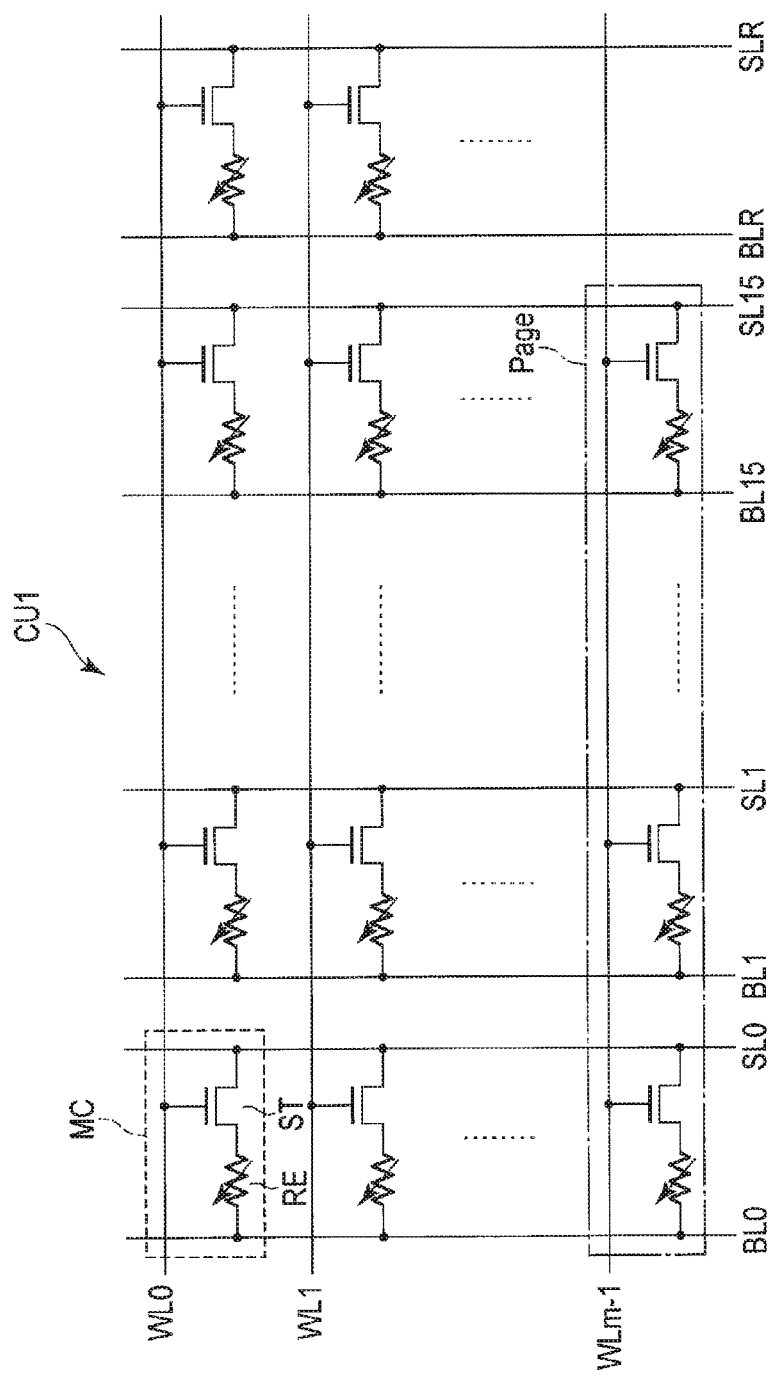
FIG. 7 is a detailed diagram illustrating a memory cell unit within a column unit in the MRAM.

FIG. 7 illustrates the details of a memory cell unit in a column unit CU1. The memory cell unit in the column unit CU1 has multiple memory cells MC arranged in a matrix manner. Further, the memory cell unit has multiple word lines WL0 to WLm-1, multiple bit lines BL0 to BL15, and multiple source lines SL0 to SL15 arranged therein. The normal column interconnect NCL corresponds to the bit lines BL0 to BL15 and the source lines SL0 to SL15. The reference column interconnect RCL corresponds to the reference bit line BLR and the reference source line SLR. The numbers of bit lines and source lines are not limited thereto. Sixteen or more bit lines and source lines may be provided.

One word line WL is connected to one row (line) in memory cell units, that is, a memory cell group for one page, and a pair of a bit line BL and a source line SL is connected to one column in memory cell units. The word lines WL0 to WLm-1 are commonly connected to the column units CU1_0 to CU1_n-1. It should be noted that m is a natural number equal to or more than 1.

A memory cell MC is connected between the bit line BL and the source line SL. The memory cell MC includes a resistance change element such as an MTJ (magnetic tunnel junction) element RE and a selection transistor ST. The selection transistor ST is constituted by, for example, an n channel MOS field effect transistor.

One end of the MTJ element RE is connected to the bit line BL, and the other end of the MTJ element RE is connected to the drain of the selection transistor ST. The source of the selection transistor ST is connected to the source line SL. Further, the gate of the selection transistor ST is connected to the word line WL.

In the configuration as shown in FIG. 6, the reference column interconnect RCL connected to the reference cell, that is, the reference column, is arranged in a column switch unit. The reference column interconnect RCL and the normal column interconnect NCL are selected using a different column switch and a different control line, respectively. Accordingly, the normal cell and the reference cell can be selected at substantially the same time by activating one word line WL for selecting the normal cell. In such a configuration, it is not necessary to activate two word lines in order to select the normal cell and the reference cell; therefore, this configuration can reduce the electric power required to activate the word line for selecting the reference cell.

In addition, since it is not necessary to form as many reference columns as the normal columns, the reference columns can be arranged without increasing the size of area by formation of the reference columns.

In this case, a reference column interconnect RCL is arranged in a column switch unit (a column unit), but the embodiment is not limited thereto. Two or more reference column interconnects may be arranged.

[1-2] Structure of MTJ Element

Next, an example structure of an MTJ element RE included in the memory cell MC will be explained. FIG. 8 is a cross sectional view illustrating the MTJ element RE. The MTJ element RE includes a lower electrode 40, a storage layer (also referred to as a free layer) 41, a nonmagnetic layer (a tunnel barrier layer) 42, a reference layer (referred to as a fixed layer) 43, and an upper electrode 44, which are arranged in order. The storage layer 41 and the reference layer 43 may be arranged in the opposite order.

The storage layer 41 and the reference layer 43 are made of a ferromagnetic material. For example, an insulating material such as MgO may be used as the tunnel barrier layer 42.

The storage layer 41 and the reference layer 43 have magnetic anisotropy in the perpendicular direction, and the direction of easy magnetization thereof is the perpendicular direction. It should be noted that the magnetization direction of the storage layer 41 and the reference layer 43 may be an in-plane direction. In the storage layer 41, the magnetization direction is variable (can be inversed). In the reference layer 43, the magnetization direction is not variable (fixed). The reference layer 43 is configured to have a perpendicular magnetic anisotropy energy sufficiently higher than the storage layer 41. The magnetic anisotropy can be configured by adjusting the material configuration and the film thickness. With such a configuration, the magnetization reversal electric current of the storage layer 41 is reduced, and the magnetization reversal electric current of the reference layer 43 is configured to be higher than that of the storage layer 41. Accordingly, the MTJ element RE can be achieved, which includes the storage layer 41 the magnetization direction of which is variable in response to a predetermined write electric current and the reference layer 43 the magnetization direction of which is not variable in response thereto.

In the present embodiment, a spin injection write method is used, in which a write electric current is directly passed to the MTJ element RE, and the magnetization state of the MTJ element RE is controlled using the write electric current. The MTJ element RE can attain any one of a low resistance state and a high resistance state in accordance with whether the relative relationship of the magnetizations of the storage layer 41 and the reference layer 43 is parallel or antiparallel.

When a write electric current is passed from the storage layer 41 to the reference layer 43 in the MTJ element RE, the relative relationship of the magnetizations of the storage layer 41 and the reference layer 43 becomes parallel. In this parallel state, the resistance value of the MTJ element RE becomes the lowest, and the MTJ element RE is configured to be in the low resistance state. The low resistance state of the MTJ element RE is defined as, for example, data "0".

On the other hand, when a write electric current is passed from the reference layer 43 to the storage layer 41 in the MTJ element RE, the relative relationship of the magnetizations of the storage layer 41 and the reference layer 43 becomes antiparallel. In this antiparallel state, the resistance value of the MTJ element RE becomes the highest, and the MTJ element RE is configured to be in the high resistance state. The high resistance state of the MTJ element RE is defined as, for example, data "1".

Accordingly, the MTJ element RE can be used as a storage device capable of storing one-bit data (binary data). Allocation of data and the resistance state in the MTJ element RE may be configured in any manner.

When data are read from the MTJ element RE, a read voltage is applied to the MTJ element RE, and the resistance value of the MTJ element RE is detected on the basis of the read electric current flowing in the MTJ element RE at this time. This read voltage is configured to be a value sufficiently lower than a threshold value for magnetization reversal by spin-transfer torque.

[2] Effects

In the first embodiment, multiple normal column interconnects NCL (or normal columns) as well as the reference column interconnect RCL (or reference column) are arranged in one column switch unit. Then, based on the selection signal of the normal column selection line NCS, the normal column interconnect NCL is selected by the normal column switch 13, and based on the selection signal of the reference column selection line RCS, the reference column interconnect RCL is selected by the reference column switch 14.

Accordingly, by activating the word line WL for selecting the normal cell, the normal cell and the reference cell can be selected at substantially the same time. Therefore, it is not necessary to activate two word lines in order to select a normal cell and a reference cell, and the electric power required to activate a word line for selecting a reference cell can be reduced.

Further, it is sufficient to provide the reference column interconnects in one column switch unit; therefore, the number of the reference column interconnects (reference columns) can be reduced.

As described above, according to the first embodiment, the number of the reference columns in the memory cell array can be reduced, and the size of area of the memory cell array increases to a lesser extent. Further, the electric power for activating a word line in the read operation can be reduced.

[Second Embodiment]

[1] Configuration of MRAM

The second embodiment is applied to a hierarchical bit line configuration in the first embodiment. As the schematic configuration of the MRAM of the present embodiment is the same as the configuration as shown in FIG. 5, an explanation thereof is omitted.

[1-1] Configuration of Memory Cell Array, Sense Amplifier, and Column Switch

FIG. 9 is a block diagram illustrating a configuration of a column unit CU2 in an MRAM of the second embodiment.

The column unit CU2 includes an array MAT 11A, a normal bit line column switch 13BL, a reference bit line column switch 14BL, a normal source line column switch 13SL, a reference source line column switch 14SL, a sense amplifier 12, a global normal bit line GNBL, a global reference bit line GRBL, and a global source line GSL.

FIG. 10 is a figure illustrating a detailed configuration of a column unit CU2 in an MRAM.

The MRAM according to the second embodiment includes multiple column units CU2_0 to CU2_n−1. Each column unit CU2 includes an array MAT 11A, a normal bit line column switch 13BL, a reference bit line column switch 14BL, a normal source line column switch 13SL, a reference source line column switch 14SL, a sense amplifier 12, a global normal bit line GNBL, a global reference bit line GRBL, and a global source line GSL.

The array MAT 11A includes multiple memory cells MC arranged in a matrix form. The array MAT 11A includes sixteen normal bit line NBL, one reference bit line RBL, sixteen normal source lines NSL, and one reference source line RSL. A pair of interconnects is formed by a normal bit line NBL and a normal source line NSL, and multiple memory cells MC are connected between the normal bit line NBL and the normal source line NSL. The reference bit line RBL and the reference source line RSL are formed as a pair. Multiple memory cells MC are connected between the reference bit line RBL and the reference source line RSL.

The memory cell provided between the reference bit line RBL and the reference source line RSL has the same structure as the memory cell provided between the normal bit line NBL and the normal source line NSL, and is formed by the same manufacturing processes. In this case, the memory cell between the normal bit line NBL and the normal source line NSL will be referred to as a normal cell, and the memory cell between the reference bit line RBL and the reference source line RSL will be referred to as a reference cell.

The sixteen normal bit lines NBL are connected via the normal bit line column switch 13BL to the global normal bit line GNBL. The reference bit line RBL is connected via the reference bit line column switch 14BL to the global reference bit line GRBL. The sixteen normal source lines NSL are connected via the normal source line column switch 13SL to the global source line GSL. The reference source line RSL is connected via the reference source line column switch 14SL to the global source line GSL. Further, the global normal bit line GNBL, the global reference bit line GRBL, and the global source line GSL are connected to the sense amplifier 12.

The normal bit line column switch 13BL is connected to normal bit line selection lines NBS. A bit line selection signal NBS is input via a normal bit line selection line NBS from the controller 16 to the normal bit line column switch 13BL. The normal bit line column switch 13BL selects one normal bit line from among the multiple normal bit lines NBL in accordance with the bit line selection signal NBS. Accordingly, the normal bit line column switch 13BL connects the selected normal bit line NBL with the sense amplifier 12 via the global normal bit line GNBL.

The reference bit line column switch 14BL is connected to the reference bit line selection line RBS. A bit line selection signal RBS is input via the reference bit line selection line RBS from the controller 16 into the reference bit line column switch 14BL. The reference bit line column switch 14BL selects the reference bit line RBL in accordance with the bit line selection signal RBS. Accordingly, the reference bit line column switch 14BL connects the selected reference bit line RBL with the sense amplifier 12 via the global reference bit line GRBL.

The normal source line column switch 13SL is connected to normal source line selection lines NSS. A source line selection signal NSS is input via a normal source line selection line NSS from the controller 16 into the normal source line column switch 13SL. The normal source line column switch 13SL selects one normal source line from among multiple normal source lines NSL in accordance with the source line selection signal NSS. Accordingly, the normal source line column switch 13SL connects the selected normal source line NSL with the sense amplifier 12 via the global source line GSL.

The reference source line column switch 14SL is connected to the reference source line selection line RSS. A source line selection signal RSS is input via the reference source line selection line RSS from the controller 16 to the reference source line column switch 14SL. The reference source line column switch 14SL selects the reference source line RSL in accordance with the source line selection signal RSS. Accordingly, the reference source line column switch 14SL connects the selected reference source line RSL with the sense amplifier 12 via the global source line GSL.

Figure 11:
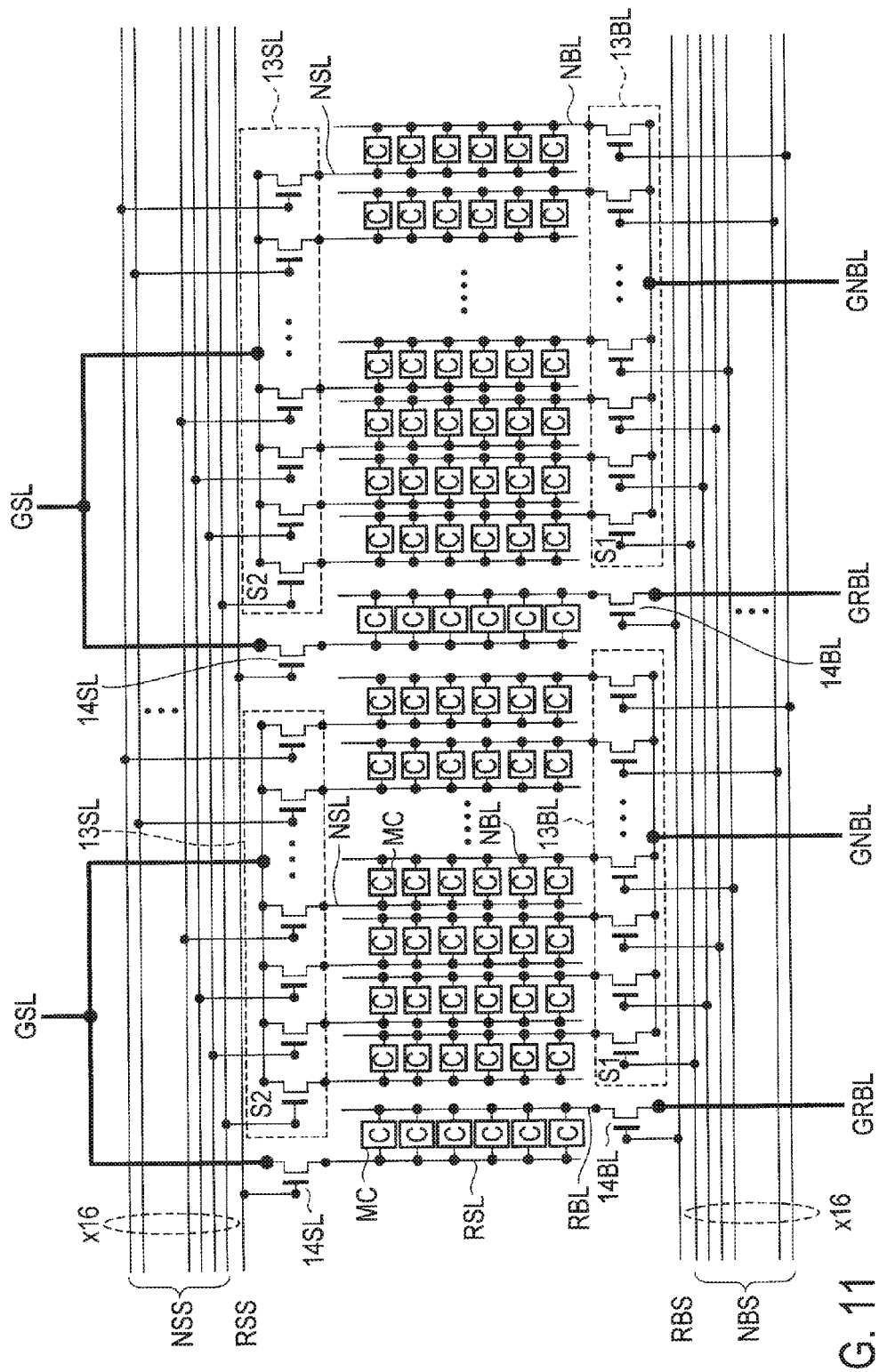
FIG. 11 is a circuit diagram illustrating an array MAT and column switches in the column unit.

FIG. 11 illustrates the details of an array MAT and column switches in the column unit CU2. FIG. 11 is a circuit diagram illustrating the array MAT and the column switches.

Multiple memory cells MC are connected between the normal bit line NBL and the normal source line NSL. Multiple memory cells MC are connected between the reference bit line RBL and the reference source line RSL.

The sixteen normal bit lines NBL are connected to the global normal bit line GNBL via the selection transistors S1 in the normal bit line column switch 13BL. The reference bit line RBL is connected via the reference bit line column switch (selection transistor) 14BL to the global reference bit line GRBL. The sixteen normal source lines NSL are connected to the global source line GSL via the selection transistors S2 in the normal source line column switch 13SL. The reference source line RSL is connected to the global source line GSL via the reference source line column switch (selection transistor) 14SL. Further, the global normal bit line GNBL, the global reference bit line GRBL, and the global source line GSL are connected to the sense amplifier 12.

Each of the normal bit line selection lines NBS is connected to the selection transistor S1 in the normal bit line column switch 13BL. A bit line selection signal NBS is input via a normal bit line selection line NBS from the controller 16 into a selection transistor S1. The selection transistor S1 in the column switch 13BL selects one normal bit line from among the multiple normal bit lines NBL in accordance with the bit line selection signal NBS. Accordingly, the column switch 13BL connects the selected normal bit line NBL to the sense amplifier 12 via the global normal bit line GNBL.

The reference bit line column switch 14BL is connected to the reference bit line selection line RBS. The bit line selection signal RBS is input via the reference bit line selection line RBS from the controller 16 into the column switch 14BL. The column switch 14BL selects the reference bit line RBL in accordance with the bit line selection signal RBS. Accordingly, the column switch 14BL connects the selected reference bit line RBL to the sense amplifier 12 via the global reference bit line GRBL.

The normal source line selection lines NSS are connected to the selection transistor S2 in the normal source line column switch 13SL. A source line selection signal NSS is input via a normal source line selection line NSS from the controller 16 into the column switch 13SL. The column switch 13SL selects one normal source line from among the multiple normal source lines NSL in accordance with the source line selection signal NSS. Accordingly, the column switch 13SL selects the selected normal source line NSL to the sense amplifier 12 via the global source line GSL.

The reference source line column switch 14SL is connected to the reference source line selection line RSS. The source line selection signal RSS is input via the reference source line selection line RSS from the controller 16 into the column switch 14SL. The column switch 14SL selects the reference source line RSL in accordance with the source line selection signal RSS. Accordingly, the column switch 14SL connects the selected reference source line RSL to the sense amplifier 12 via the global source line GSL.

[2] Read Operation and Write Operation

Subsequently, a read operation and write operation of the MRAM according to the second embodiment will be explained. FIG. 12 is a timing chart illustrating the read operation and the write operation of the MRAM.

In the read operation, the operation is performed as follows. First, the MRAM is activated by an activation signal ACT. Subsequently, a row address RADD and a column address CADD are output from the controller 16.

Subsequently, the controller 16 outputs a row address RADD to the row decoder 15. The row decoder 15 selects a word line based on the row address RADD, and activates the word line SWL.

The controller 16 provides a bit line selection signal NBS and a source line selection signal NSS to the column switches 13BL, 13SL, respectively. The column switches 13BL, 13SL select the normal bit line NBL and the normal source line NSL via the bit line selection signal NBS and the source line selection signal NSS, respectively, and connect the selected normal bit line NBL and the normal source line NSL to the global normal bit line GNBL and the global source line GSL, respectively.

Accordingly, a cell electric current Icell flows from the sense amplifier 12 into a normal cell (selected memory cell) connected to a selected normal bit line NBL and a selected normal source line NSL, and the selected word line.

The controller 16 provides a bit line selection signal RBS and a source line selection signal RSS to the column switches 14BL, 14SL, respectively. The column switches 14BL, 14SL select the reference bit line RBL and the reference source line RSL in accordance with the bit line selection signal RBS and the source line selection signal RSS, respectively, and connect the selected reference bit line RBL and the selected reference source line RSL to the global reference bit line GRBL and the global source line GSL, respectively.

Accordingly, a reference electric current Iref flows from the sense amplifier 12 to a reference cell connected to the selected reference bit line RBL and the selected reference source line RSL, and the selected word line.

Subsequently, when a sense signal SEN is input into the sense amplifier 12, the sense amplifier 12 compares the cell electric current Icell and the reference electric current Iref, and detects and amplifies data stored in the selected memory cell based on the relationship of the magnitude thereof.

In FIG. 12, reference symbol A indicates a voltage that appears in the global normal bit line GNBL, the global reference bit line GRBL, and the global source line GSL when the data of the selected memory cell is either "0" or "1" during a reading operation. For example, in a case of an electric current detect-type sense amplifier, the magnitudes of the electric current values of the cell electric current Icell flowing in the global normal bit line GNBL and the reference electric current Iref flowing in the global reference bit line GRBL are compared, and data of the selected memory cell are detected. At this occasion, the electric current difference between the cell electric current Icell and the reference electric current Iref is generated from the difference of the voltages of the global normal bit line GNBL and the global reference bit line GRBL. Therefore, the difference of the voltages of the global normal bit line GNBL and the global reference bit line GRBL may be considered to be the electric current difference of the cell electric current Icell and the reference electric current Iref.

In the write operation, the operation will be performed as follows. Portions different from the read operation explained above will be explained.

First, in the write operation, the reference electric current is not used; therefore, the reference bit line column switch 14BL is deactivated by the bit line selection signal RBS. Likewise, the reference source line column switch 14SL is deactivated by the source line selection signal RSS.

Subsequently, a write activation signal WDA is provided to the write driver WD by a write signal WR. When the write driver WD receives the write activation signal WDA, the write driver WD applies "High (H)" to the global normal bit line GNBL applies "Low (L)" to the global source line GSL. The write driver WD also applies "Low (L)" to the global normal bit line GNBL and applies "High (H)" to the global source line GSL. It should be noted that the global reference bit line GRBL is at "Low (L)". Accordingly, the selected memory cell is written.

[3] Generation of Reference Electric Current from Reference Cell ("0", "1")

For example, in order to obtain the reference electric current Iref from the reference cell, "0" and "1" are written to the reference cells, and the electric current $I_0$ and the electric current $I_1$ obtained from the reference cells having "0" and "1" are used to generate the reference electric current Iref.

[3-1] Averaging Method

In this case, an averaging method will be explained, in which an average of the electric current $I_0$ obtained from the reference cell storing "0" and the electric current $I_1$ obtained from the reference cell storing "1" is obtained, and the average value thereof is adopted as the reference electric current Iref.

Figure 13:
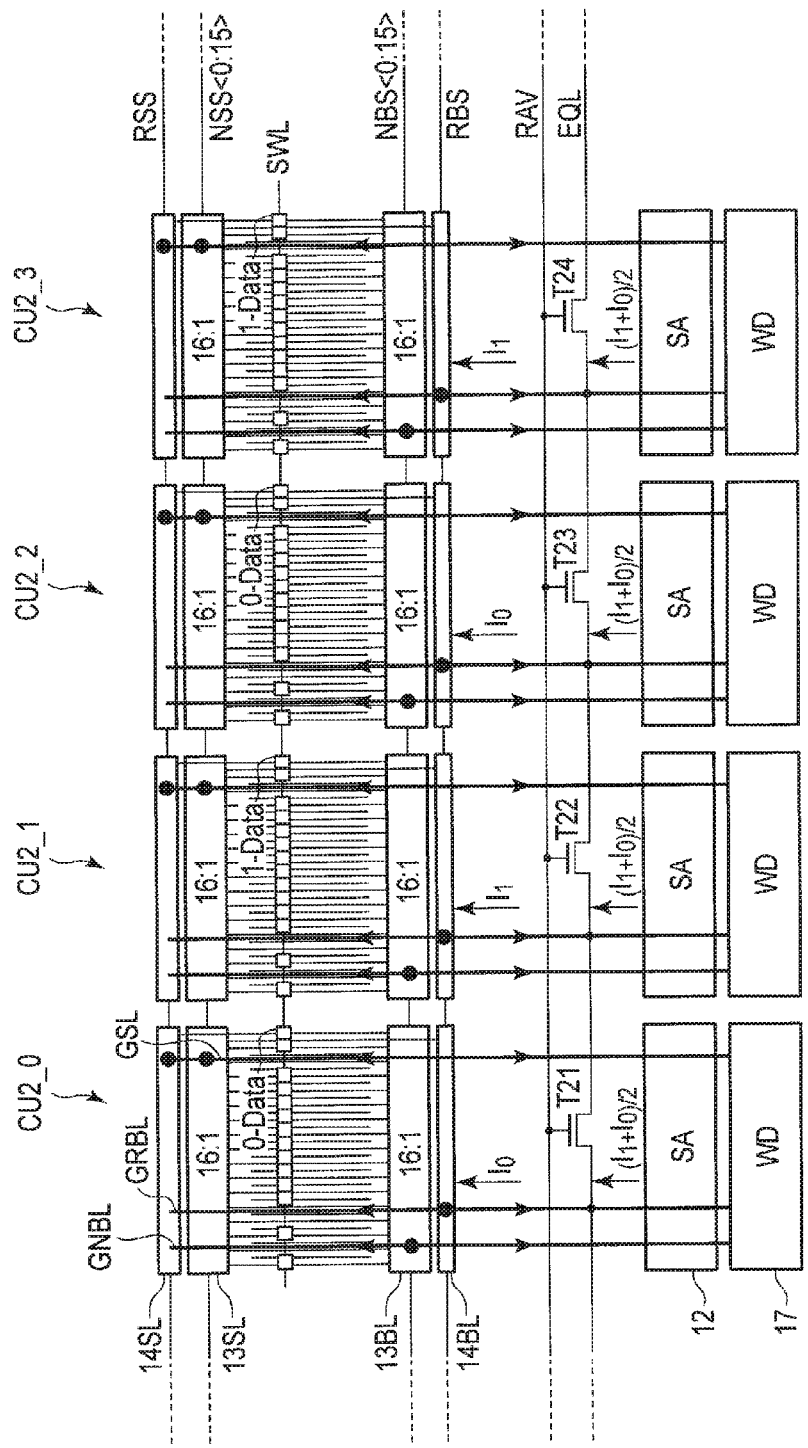
FIG. 13 is a figure illustrating a configuration of a column unit in a case where an averaging method is used in the MRAM.

FIG. 13 is a figure illustrating a configuration of a column unit in a case where the averaging method is used in the MRAM according to the second embodiment.

As shown in the drawings, the global normal bit line GNBL, the global reference bit line GRBL, and the global source line GSL are connected via the sense amplifier 12 to the write driver (WD) 17 for performing writing.

A MOS transistor is connected between adjacent global reference bit lines GRBL. This will be explained in detail using an example of a case where column units CU2_0 to CU2_3 are arranged. A MOS transistor T21 is connected between the global reference bit line GRBL in the column unit CU2_0 and the global reference bit line GRBL in the column unit CU2_1. Likewise, a MOS transistor T22 is connected between the global reference bit line GRBL in the column unit CU2_1 and the global reference bit line GRBL in the column unit CU2_2. A MOS transistor T23 is connected between the global reference bit line GRBL in the column unit CU2_2 and the global reference bit line GRBL in the column unit CU2_3. Further, a MOS transistor T24 is connected between the global reference bit line GRBL in the column unit CU2_3 and the global reference bit line GRBL in the adjacent column unit CU2_4.

In this case, "0" is stored to the reference cells in the column units CU2_0, CU2_2, and the electric current $I_0$ flows through the global reference bit line GRBL in the column units CU2_0, CU2_2, and "1" is stored to the reference cells in the column units CU2_1, CU2_3, and the electric current $I_1$ flows through the global reference bit line GRBL in the column units CU2_1, CU2_3. Writing of "0" and "1" to the reference cells will be explained later in detail.

The gates of the MOS transistors T21, T22, T23, T24 are connected to the control line RAV. When the reference electric current Iref is formed, the control line RAV causes the MOS transistors T21, T22, T23, T24 to be in the ON state (connection state), and connects the multiple global reference bit lines. Accordingly, the electric current $I_0$ and the electric current $I_1$ flowing in the global reference bit line GRBL are averaged. The sense amplifier 12 uses, as the reference electric current Iref, the electric current obtained by averaging the electric current $I_0$ and the electric current $I_1$, thus detecting data stored in the selected memory cell.

[3-2] Writing Reference Cell when Power is ON

Subsequently, an example where writing is performed when the power in ON will be explained as an example of writing of "0" and "1" to the reference cells. FIG. 14 is a figure illustrating a configuration in a case where the reference cell is written when the power is ON in the MRAM according to the second embodiment.

The MRAM as shown in FIG. 14 includes not only the configuration as shown in FIG. 13 but also the following configuration. The power ON detector 21 detects the power ON state, and outputs a signal PON to the reference cell write controller 22. The address controller 23 receives an address ADD from the outside, and outputs a row address RADD and a column address CADD. The command decoder 24 decodes a command COM which is input from the outside, and outputs various kinds of control signals ACT and the like.

At one side of the row decoder 15, switch decoders BSWD, RBSWD are provided. The switch decoder BSWD outputs the bit line selection signal NBS for selecting the normal bit line NBL. The switch decoder RBSWD outputs the bit line selection signal RBS for selecting the reference bit line RBL.

At the other side of the row decoder 15, switch decoders SSWD, RSSWD are provided. The switch decoder SSWD outputs the source line selection signal NSS for selecting the normal source line NSL. The switch decoder RSSWD outputs the source line selection signal RSS for selecting the reference source line RSL.

The sense amplifier controller 25 outputs a sense signal SEN to control operations of the sense amplifier 12_0 and the sense amplifier 12_1. The sense amplifier controller 25 also outputs a signal RAV, and averages the electric current $I_1$ and the electric current $I_0$, thus generating the reference electric current Iref. OR circuits OR1, OR2, OR3 are provided to generate various kinds of control signals.

The write drivers 17_0, 17_1 write the memory cells in the column units CU2_0, CU2_1, respectively. The write driver controller 26 outputs the write activation signal WDA to the write drivers 17_0, 17_1, and activates the write drivers 17_0, 17_1. Further, multiplexers MX1, MX2, and inverters IV1 to IV4 are provided. The multiplexers MX1, MX2 and the inverters IV1 to IV4 provide the write drivers 17_0, 17_1 with signals Dref <X> and Dref <X+1> commanding write data.

Figure 15:
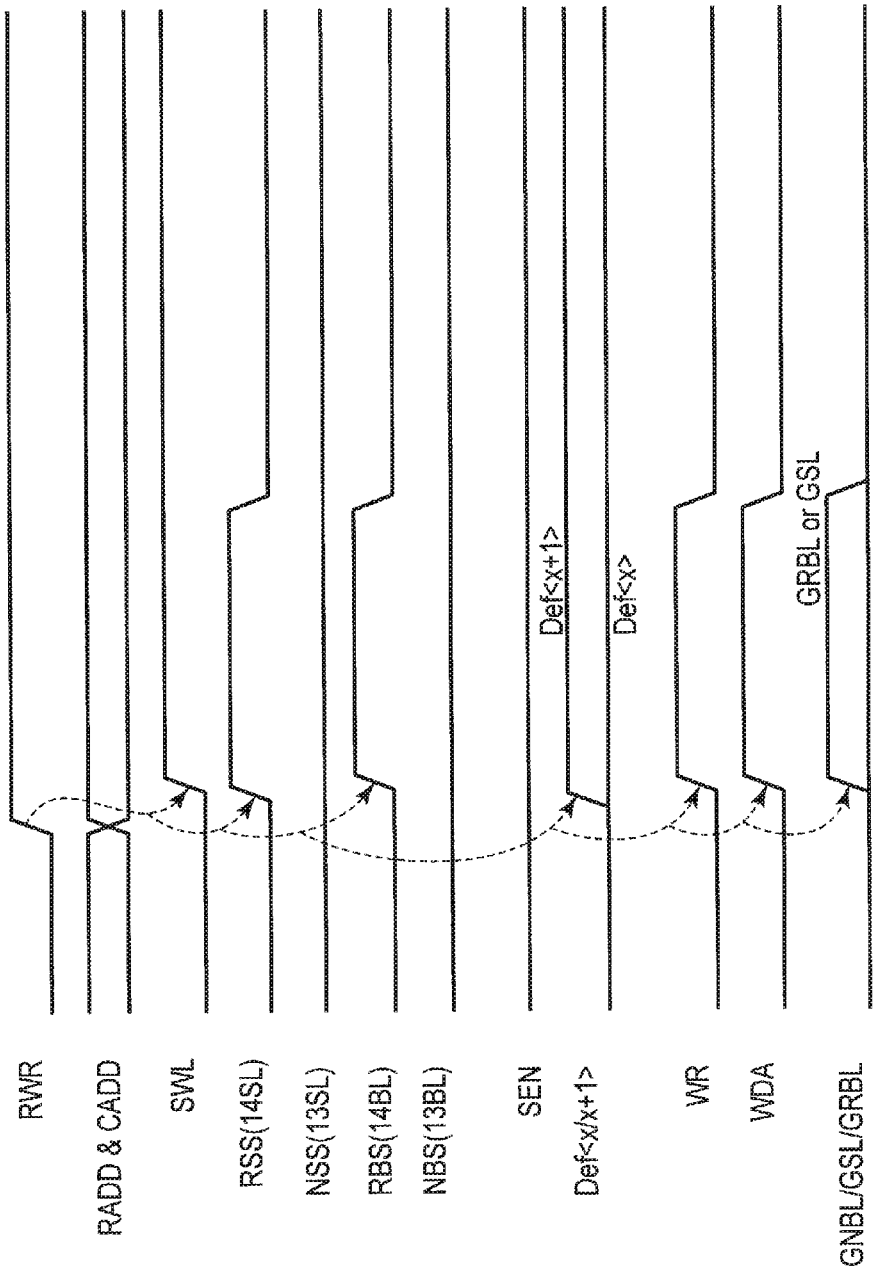
FIG. 15 is a timing chart in a case where a reference cell is written in the power on state.

FIG. 15 is a timing chart in a case where the reference cell is written when the power is ON.

When the power ON detector 21 detects the power On state, the reference cell write controller 22 outputs a signal RWR for commanding writing to the reference cell.

The address ADD is provided to the address controller 23. The address controller 23 outputs the row address RADD to the row decoder 15, and outputs the column address CADD to the switch decoders BSWD, SSWD, RBSWD, RSSWD, respectively.

When the row decoder receives the row address RADD, the row decoder selects and activates the word line based on the row address RADD.

When the switch decoders BSWD, RBSWD at the bit line receive the column address CADD, the switch decoders BSWD, RBSWD output the bit line selection signals NBS, RBS to the column switches 13BL, 14BL, respectively. The column switch 13BL attains the non-activated state based on the bit line selection signal NBS, and the normal bit line NBL is not selected. The column switch 14BL selects the reference bit line RBL based on the bit line selection signal RBS.

When the switch decoders SSWD, RSSWD at the source line receive the column address CADD, the switch decoders SSWD, RSSWD output the source line selection signals NSS, RSS to the column switch 13SL, 14SL, respectively. The column switch 13SL attains the non-activated state based on the source line selection signal NSS, and the normal source line NSL is not selected. The column switch 14SL selects the reference source line RSL based on the source line selection signal RSS.

Subsequently, when the write signal WR is input into the write driver controller 26, the write driver controller 26 provides the write activation signal WDA to the write drivers 17_0, 17_1. Further, the write driver 17_0 receives a signal Dref <X> commanding write of "1" from the multiplexer MX1. The write driver 17_1 receives a signal Dref <X+1> commanding write of "0" from the multiplexer MX2.

When the write driver 17_0 receives the write activation signal WDA and the signal Dref <X>, the write driver 17_0 applies "High (H)" or "Low (L)" to the global reference bit line GRBL, and applies "Low (L)" or "High (H)" to the global source line GSL, respectively and writes "1" to the reference cell.

When the write driver 17_1 receives the write activation signal WDA and the signal Dref <X+1>, the write driver 17_1 applies "Low (L)" or "High (H)" to the global reference bit line GRBL, and applies "High (H)" or "Low (L)" to the global source line GSL, respectively and writes "0" to the reference cell. Therefore, "1" or "0" is written to the reference cell.

[4] Effects

In the second embodiment, not only multiple normal bit lines and multiple normal source lines but also the reference bit line and the reference source line are provided within one column switch unit. Based on the bit line selection signal NBS and the source line selection signal NSS, the normal column switches 13BL, 13SL select the normal bit line and the normal source line, respectively. Further, based on the bit line selection signal RBS and the source line selection signal RSS, the reference column switches 14BL, 14SL select the reference bit line and the reference source line, respectively.

In such configuration, the normal cell and the reference cell can be selected at substantially the same time by activating the word line WL for selecting the normal cell. Therefore, in order to select the normal cell and the reference cell, it is not necessary to activate two word lines, and the electric power required to activate the word line for selecting the reference cell can be reduced.

It is sufficient to provide the minimum reference bit lines and the minimum reference source lines within one column switch unit; therefore, the reference bit lines and the reference source lines (reference column) can be reduced.

In a hierarchical bit line configuration, the global bit line is connected to the column switch accompanied by each array MAT. The data stored in the selected memory cell are transmitted via the global bit line to the sense amplifier, and the sense amplifier amplifies and determines the data. In the second embodiment, the number of global lines accompanied by the reference cell can be reduced. More specifically, the global source line can be shared in both of the cases where the cell electric current Icell flows into the normal cell connected to the normal bit line and the case where the reference electric current Iref flows into the reference cell connected to the reference bit line; therefore, one global source line can be eliminated.

As described above, according to the second embodiment, the reference column in the memory cell array can be reduced, and the size of area of the memory cell array increases to a lesser extent. In addition, in the read operation, the electric power for activating the word line can be reduced, and further, the global line can be reduced.

In the embodiments, an MRAM that uses the magnetoresistive effect element as the resistance change memory has been explained as an example. However, the embodiments are not limited thereto. Regardless of a volatile memory or a non-volatile memory, the embodiments can be applied to various kinds of semiconductor memory devices. For example, the embodiments can be applied to the same type of resistance change memory as the MRAM, for example, a ReRAM (Resistive Random Access Memory), a PCRAM (Phase-Change Random Access Memory), and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A resistance change memory comprising:
    a first memory cell array arranged with memory cells having resistance change elements, wherein first ends of the memory cells are connected to first normal bit lines, and second ends of the memory cells are connected to first normal source lines;
    a first column switch configured to select one of the first normal bit lines, and to connect the selected one of the first normal bit lines to a first global bit line;
    a second column switch configured to select one of the first normal source lines, and to connect the selected one of the first normal source lines to a first global source line;
    at least a first reference cell arranged in the first memory cell array, wherein a first end of the first reference cell is connected to a reference bit line and a second end of the first reference cell is connected to a reference source line;
    a third column switch configured to connect the reference bit line connected to the first reference cell to a second global bit line;
    a fourth column switch configured to connect the reference source line connected to the first reference cell to the first global source line;
    a first sense amplifier connected to the first global bit line and the second global bit line, and configured to read data stored in any one of the memory cells;
    a word line connected to the memory cells, wherein if a read operation is performed, the word line is activated so that at least one of the memory cells is selected;
    a second memory cell array arranged with memory cells having resistance change elements, wherein first ends of the memory cells are connected to second normal bit lines, and second ends of the memory cells are connected to second normal source lines;
a fifth column switch configured to select one of the second normal bit lines, and to connect the selected one of the second normal bit lines to a third global bit line;
a sixth column switch configured to select one of the second normal source lines, and to connect the selected one of the second normal source lines to a second global source line;
at least a second reference cell arranged in the second memory cell array, wherein a first end of the second reference cell is connected to a second reference bit line and a second end of the second reference cell is connected to a second reference source line;
a seventh column switch configured to connect the second reference bit line connected to the second reference cell to a fourth global bit line;
an eighth column switch configured to connect the second reference source line connected to the second reference cell to the second global source line;
a second sense amplifier, connected to the third global bit line and the fourth global bit line, and configured to read data stored in any one of the memory cells in the second memory cell array; and
a switch circuit provided between the second global bit line and the fourth global bit line, and configured to connect the second global bit line and the fourth global bit line,
wherein if power is turned on, the first sense amplifier writes first data to the first reference cell, and the second sense amplifier writes second data to the second reference cell.

2. The resistance change memory according to claim 1, wherein if the read operation is performed, the first sense amplifier flows a cell electric current to the selected normal bit line, flows a reference electric current to the reference bit line, and compares the cell electric current and the reference electric current.

3. The resistance change memory according to claim 1, wherein if the read operation is performed, the switch circuit is caused to be in a conductive state, whereby a reference electric current is generated by averaging electric currents flowing in the second global bit line and the fourth global bit line, and
wherein if the read operation is performed, the first sense amplifier compares a reference electric current flowing in the reference bit line and a cell electric current flowing in the selected normal bit line.

4. The resistance change memory according to claim 1, wherein the memory cells have a same structure.

5. The resistance change memory according to claim 1, wherein the resistance change memory includes an MRAM (magnetoresistive random access memory).

6. A resistance change memory comprising:
first memory cell arrays arranged with normal cells and reference cells having resistance change elements;
normal bit lines connected to the normal cells of each of the first memory cell arrays;
normal source lines connected to the normal cells;
a first column switch configured to select any one of the normal bit lines, and to connect the selected one of the normal bit lines to a first global bit line;
a second column switch configured to select any one of the normal source lines, and to connect the selected one of the normal source lines to a first global source line;
a first reference bit line connected to first reference cells of each of the first memory cell arrays;
a first reference source line connected to the first reference cells;
a third column switch configured to connect the first reference bit line to a second global bit line;
a fourth column switch configured to connect the first reference source line to the first global source line;
a first sense amplifier connected to the first global bit line and the second global bit line, and configured to read data stored in any one of the normal cells;
word lines connected to the normal cells and the reference cells, wherein if a read operation is performed, any one of the word lines is activated so that at least one of the normal cells and at least one of reference cells are selected;
second memory cell arrays arranged with normal cells and reference cells having resistance change elements;
normal bit lines connected to the normal cells of each of the second memory cell arrays;
normal source lines connected to the normal cells;
a fifth column switch configured to select any one of the normal bit lines, and to connect the selected one of the normal bit lines to a third global bit line;
a sixth column switch configured to select any one of the normal source lines, and to connect the selected one of the normal source lines to a second global source line;
a second reference bit line connected to second reference cells of each of the second memory cell arrays;
a second reference source line connected to the second reference cells;
a seventh column switch configured to connect the second reference bit line to a fourth global bit line;
an eighth column switch configured to connect the second reference source line to the second global source line;
a second sense amplifier connected to the third global bit line and the fourth global bit line, and configured to read data stored in any one of the normal cells; and
a switch circuit provided between the second global bit line and the fourth global bit line, and configured to connect the second global bit line and the fourth global bit line,
wherein if power is turned on, the first sense amplifier writes first data to the first reference cell, and the second sense amplifier writes second data to the second reference cell.

7. The resistance change memory according to claim 6, wherein if the read operation is performed, the first sense amplifier flows a cell electric current to the normal cell and flows a reference electric current to the reference cell, and compares the cell electric current and the reference electric current.

8. The resistance change memory according to claim 6, wherein if the read operation is performed, the switch circuit is caused to be in a conductive state, whereby a reference electric current is generated by averaging electric currents flowing in the second global bit line and the fourth global bit line; and
wherein if the read operation is performed, the first sense amplifier compares the reference electric current and a cell electric current flowing in the first global bit line.

9. The resistance change memory according to claim 6, wherein the normal cell and the reference cell have a same structure.

10. The resistance change memory according to claim 6, wherein the resistance change memory includes an MRAM (magnetoresistive random access memory).

* * * * *